(12) United States Patent
Ishitani et al.

(10) Patent No.: US 6,206,352 B1
(45) Date of Patent: Mar. 27, 2001

(54) CIRCUIT BOARD HOLDING APPARATUS

(75) Inventors: Yasuyuki Ishitani, Kofu; Makito Seno, Yamanashi, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/202,420

(22) PCT Filed: Jun. 19, 1997

(86) PCT No.: PCT/JP97/02103

§ 371 Date: Dec. 14, 1998

§ 102(e) Date: Dec. 14, 1998

(87) PCT Pub. No.: WO97/49272

PCT Pub. Date: Dec. 24, 1997

(30) Foreign Application Priority Data

Jun. 21, 1996 (JP) .................................................... 8-161951

(51) Int. Cl.[7] ...................................................... B23Q 3/00
(52) U.S. Cl. ................ 269/13; 269/21; 269/25; 269/152; 269/224; 269/403
(58) Field of Search ............................. 269/21, 152, 13, 269/14, 157–163, 224, 903, 25

(56) References Cited

U.S. PATENT DOCUMENTS

| 1,850,806 | * | 3/1932 | Noel ........................................ 269/13 |
| 4,700,488 | * | 10/1987 | Curti ........................................ 269/21 |
| 4,928,936 | * | 5/1990 | Ohkubo et al. ........................ 269/21 |
| 4,951,240 | | 8/1990 | Fukino . |
| 5,580,415 | * | 12/1996 | Diekwisch .............................. 269/21 |
| 5,916,689 | * | 6/1999 | Collins et al. ......................... 269/13 |

FOREIGN PATENT DOCUMENTS 0 392 516    10/1990    (EP) .

* cited by examiner

Primary Examiner—Robert C. Watson
(74) Attorney, Agent, or Firm—Wenderoth, Lind & Ponack, L.L.P.

(57) ABSTRACT

When a movable member (14) is moved from a gripping position in which a circuit board (2) was gripped by the movable member (14) and a stationary member (13), a separation mechanism (7, 12) forcibly separates the circuit board from the stationary member (13), to thereby prevent the occurrence of a state in which the circuit board (2) is stuck to the stationary member.

9 Claims, 5 Drawing Sheets

CIRCUIT BOARD HOLDING APPARATUS

DESCRIPTION

1. Technical Field

The present invention relates to a circuit board holding apparatus which is provided for a component mounting apparatus for mounting, for example, electronic components onto a circuit board such as a printed board and executes holding and releasing the hold of the circuit board, and to a circuit board hold releasing method executed by the circuit board holding apparatus.

2. Background Art

In a component mounting apparatus for mounting electronic components onto a printed board, a portion which executes securing and holding of the printed board in the stage of mounting the electronic components is constructed as follows. That is, as shown in FIGS. 7 and 8, a circuit board holding apparatus 1 for securing and holding a printed board 2 is provided on an X-Y table for moving the printed board 2 in X- and Y-directions. On the circuit board holding apparatus 1 is fixed a pair of stationary members 13 which extend parallel to the X-direction and have an approximately inverted L-like sectional shape. Also provided are a pair of movable members 14 which extend in the X-direction along inner side surfaces 13a of the stationary members 13 and oppose each other at both the stationary members 13 and slide in a Z-direction between a board gripping position 20 and a board releasing position 21 while being guided along the inner side surfaces 13a. In such a circuit board holding apparatus 1, the printed board 2 is conveyed into a region between both the stationary members 13. Then, by moving upward both of the movable members 14 into the board gripping position 20 by means of drive units 15 having, for example, an air cylinder, the edge portions 2a of the printed board 2 extending in the X-direction are gripped by board contact surfaces 13b of the stationary members 13 and board contact surfaces 14b of the movable members 14, so that the printed board 2 is secured to the circuit board holding apparatus 1.

The X-Y table on which the printed board 2 is secured in this manner is moved into a specified position in the X- and Y-directions, and mounting of electronic components onto the printed board 2 is executed by an electronic component mounting unit 3. After the operation of mounting specified electronic components onto the printed board 2 is completed, the drive units 15 are operated to move the movable members 14 downward to the board releasing position 21 as shown in FIG. 9, where the gripping of the printed board 2 is released and the printed board 2 is conveyed to the next process.

However, in the aforementioned circuit board holding apparatus 1, there may occur a phenomenon that the printed board 2 sticks to the stationary members 13 as shown in FIG. 10 depending on the surface conditions of the printed board 2 in spite of the fact that the movable members 14 have been moved down to the board releasing position 21. That is, it is sometimes the case where a rubber material is attached or coated on the board contact surface 13b of the stationary member 13 and the board contact surface 14b of the movable member 14 for the purpose of increasing the frictional force between the stationary member 13 and the movable member 14 and the printed board 2 so that the displacement of the printed board 2 should not occur in the X-direction in the state in which the printed board 2 is gripped. Therefore, in the case where a flux is coated on the front and rear surfaces of the printed board 2 or in a similar case, the aforementioned rubber material and the front and rear surfaces of the printed board 2 might stick to each other due to the aforementioned gripping operation. After such a stuck state has occurred, the printed board 2 falls onto the movable members 14 side by its own gravity. However, this disadvantageously causes a state in which the positions of the electronic components mounted on the printed board 2 are displaced by the falling of the printed board 2, a state in which the printed board 2 cannot be conveyed to the next process or a similar state.

SUMMARY OF THE INVENTION

The present invention has been developed to solve the above issue and provide a circuit board holding apparatus which prevents the occurrence of displacement of the mounted electronic components and the state in which the printed board cannot be conveyed to the next process after the electronic components have been mounted onto the circuit board, and a circuit board hold releasing method to be executed by the circuit board holding apparatus.

In accomplishing these and other aspects, according to a first aspect of the present invention, there is provided a circuit board holding apparatus for holding a circuit board by gripping a pair of opposed edge portions of a circuit board, comprising:

stationary members which are arranged opposite the edge portions and contact a front surface of the circuit board;

movable members which contact a rear surface of the circuit board and grip each of the edge portions of the circuit board between the movable member and the stationary member in a direction of thickness of the circuit board by moving into a board gripping position, the movable members moving in the direction of thickness of the circuit board between the board gripping position and a board releasing position; and a separation mechanism for forcibly separating the circuit board from the stationary members when the movable members move from the board gripping position to the board releasing position for releasing the hold of the circuit board.

According to a second aspect of the present invention, there is provided a circuit board holding apparatus as defined in the first aspect, wherein the separation mechanism is a pressing member which is mounted to the stationary member and puts the circuit board into pressure contact with the movable member.

According to a third aspect of the present invention, there is provided a circuit board holding apparatus as defined in the second aspect, wherein, when the front and rear surfaces of the circuit board are located upward and downward and the movable member moves in a vertical direction, the pressing member is an elastic member having one end-portion to be fixed to the stationary member and the other end portion which is to contact the front surface of the circuit board and presses the circuit board against the movable member.

According to a fourth aspect of the present invention, there is provided a circuit board holding apparatus as defined in the first aspect, wherein the separation mechanism is a suction unit having a suction section which is arranged on the rear surface side of the circuit board and attracts by suction the rear surface of the circuit board, and a drive unit which moves the suction section in a direction in which the movable member moves together with the moving of the movable member.

According to a fifth aspect of the present invention, there is provided a circuit board holding apparatus as defined in the fourth aspect, further comprising a control unit which controls the start of the moving of the movable member from the board gripping position the into the board releasing position, start of the sucking of the circuit board by the suction unit, and the moving of the suction unit by means of the drive unit.

According to a sixth aspect of the present invention, there is provided a circuit board hold releasing method to be executed by a circuit board holding apparatus which grips a pair of opposed edge portions of a circuit board in a direction of thickness of the circuit board by means of a stationary member and a movable member moving between a board gripping position and a board releasing position, thereby holding the circuit board, comprising:

moving the movable member into the board releasing position in a process of releasing the gripping of the circuit board; and making the circuit board contact the movable member together with the moving of the movable member toward the board releasing position side.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
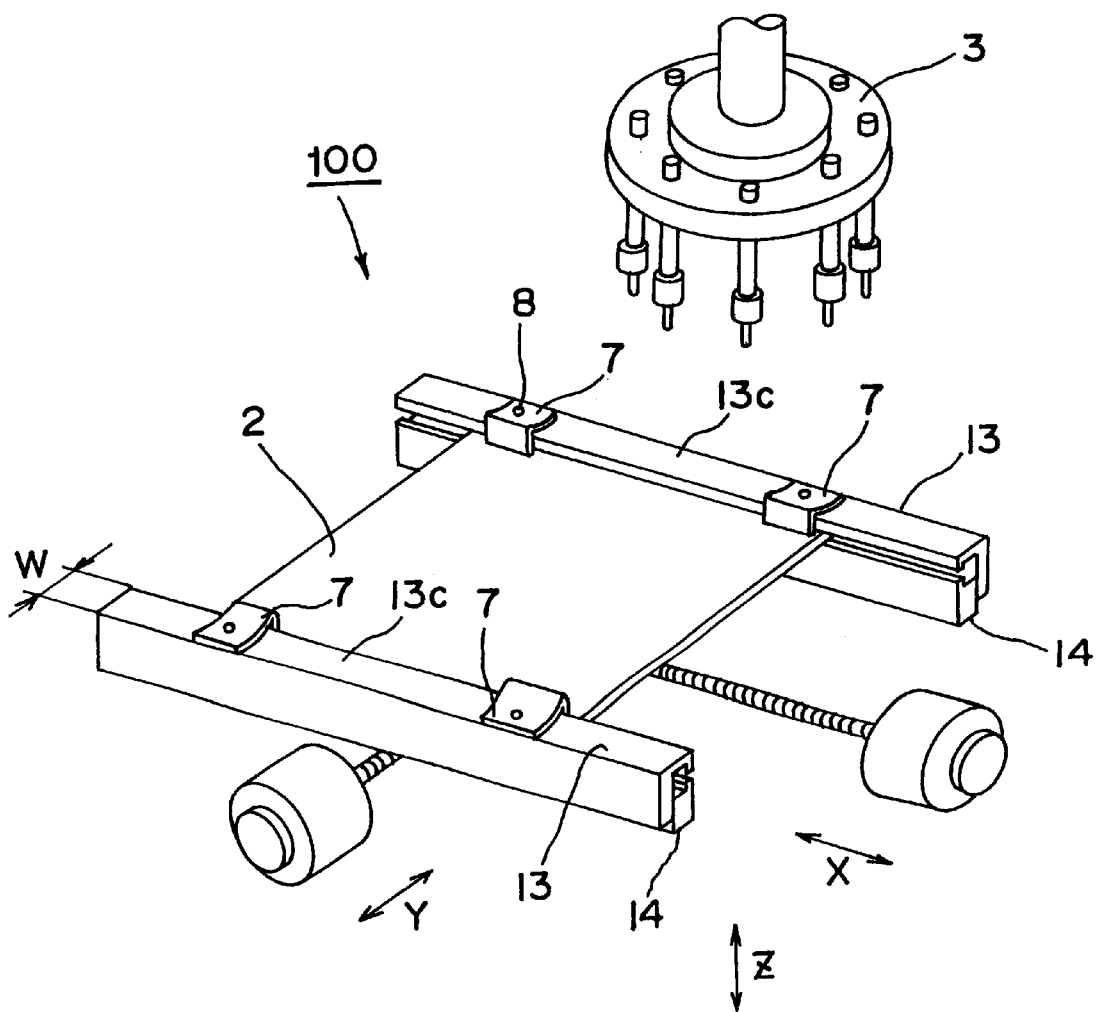
FIG. 1 is a perspective view showing the total construction of a circuit board holding apparatus according to an embodiment of the present invention.

Before the description of the present invention proceeds, it is to be noted that like parts are designated by like reference numerals throughout the accompanying drawings.

A circuit board holding apparatus and a circuit board hold releasing method according to an embodiment of the present invention will be described below with reference to the drawings. It is to be noted that the circuit board hold releasing method is executed by the circuit board holding apparatus. Further, identical components are denoted by the same reference numerals in the figures.

Figure 2:
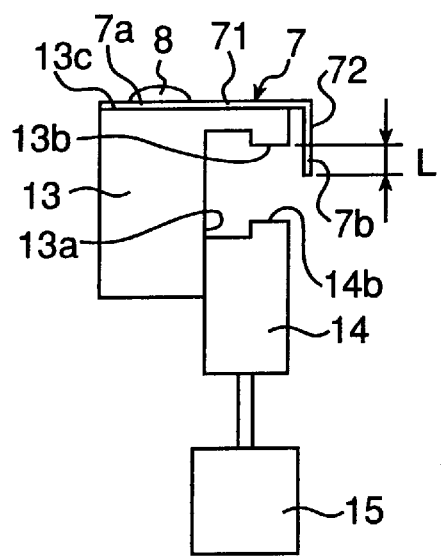
FIG. 2 is a side view showing a state in which a pressing member shown in FIG. 1 is mounted to a stationary member.

As shown in FIG. 1, on upper surfaces 13c of stationary members 13 of a circuit board holding apparatus 100 of the present embodiment are mounted four L-shaped pressing members 7, two of which are arranged on the upper surface 13c of one of the stationary member 13, and two of which are arranged on the upper surface 13c of the other one of the stationary member 13, so that they are located at the four corners of a printed board 2, which is an example of a circuit board in the present invention. It is to be noted that the pressing member 7 is an example of a separating mechanism in the present invention. The pressing member 7 is an elastic member formed by integrating a fixing section 71 with a contact section 72 which bends toward the printed board 2 side with respect to the fixing section 71 as shown in FIG. 2. The fixation section 71 has a length slightly greater than a width dimension W of the upper surface 13c, and as described later, it extends in contact with the upper surface 13c when the movable member 14 is in the board releasing position 21. Such a fixing section 71 is mounted to the upper surface 13c of the stationary member 13 by means of a screw 8 at one end portion 7a of the pressing member 7 located on the side opposite the contact section 72. Therefore, the pressing member 7 is fixed to the stationary member 13. The contact section 72 extends downward by a dimension L beyond the board contact surface 13b of the stationary member 13. Therefore, as described later, when the movable member 14 is located near the board gripping position 20, the other end portion 7b of the pressing member 7 contacts the front surface 2b of the printed board 2 arranged on the upper side.

The operation of the pressing members 7 constructed as above will be described below.

Figure 3:
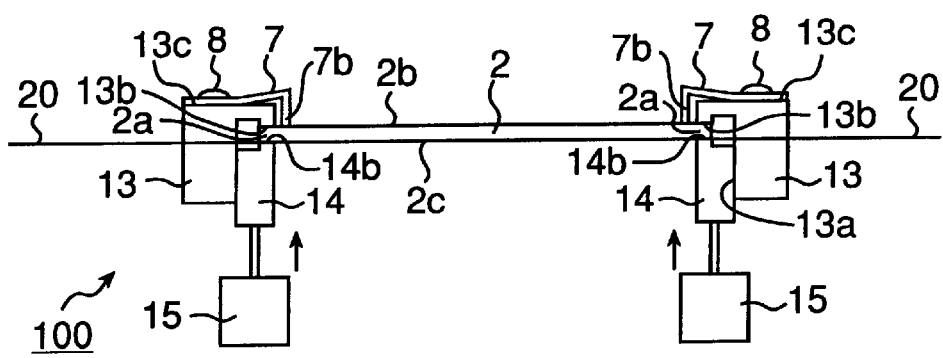
FIG. 3 is a side view showing a state in which movable members are arranged in a board gripping position in the circuit board holding apparatus shown in FIG. 1.

Similarly to the aforementioned prior art, after the printed board 2 is conveyed into the region between the stationary members 13, the movable members 14 are moved upward by the operation of drive units 15, and the edge portions 2a of the printed board 2 are gripped by the board contact surfaces 13b of the stationary members 13 and the board contact surfaces 14b of the movable members 14 as shown in FIG. 3. The pressing member 7 has its one end portion 7a fixed to the stationary member 13 by means of the screw 8 and has the other end portion 7b protruded by the dimension L below the board contact surface 13b. Therefore, the front surface 2b of the printed board 2 and the other end portion 7b contact each other just before the edge portion 2a of the printed board 2 is completely gripped. When the printed board 2 is completely gripped by the stationary member 13 and the movable member 14, the fixing section 71 of the pressing member 7 warps upward with the point fixed by the screw 8 serving as a fulcrum. Therefore, in the state in which the printed board 2 is gripped by the stationary member 13 and the movable member 14, the other end portion 7b presses the front surface 2b of the printed board 2 downward, i.e., toward the movable member side by the elastic force of the pressing member 7.

Figure 4:
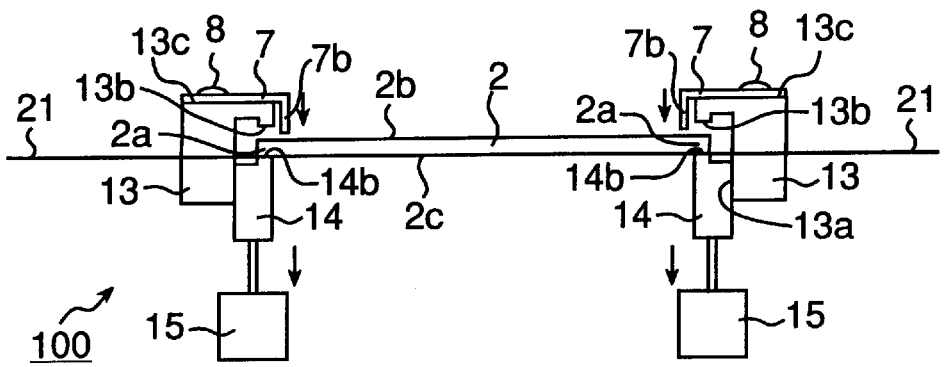
FIG. 4 is a side view showing a state in which the movable members are arranged in a board releasing position in the circuit board holding apparatus shown in FIG. 1.
Figure 5:
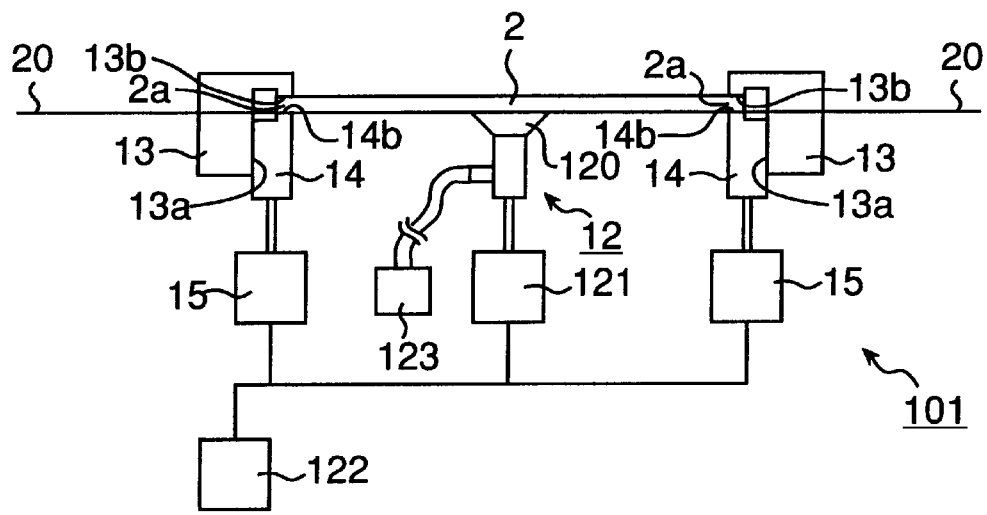
FIG. 5 is a side view showing a circuit board holding apparatus according to a second embodiment of the present invention in a state in which movable members are arranged in a board gripping position.

Similarly to the prior art, after the electronic components are mounted to the printed board 2 as described above, the movable members 14 move downward with the left and right drive units 15 synchronized with each other in operation. In this stage, the two edge portions 2a of the printed board 2 are forcibly toward the movable member side by the other end portions 7b of the pressing members 7. Therefore, even when the front surface 2b of the printed board 2 is in the state in which it is stuck to the board contact surfaces 13b of the stationary members 13, the stuck state is released by the pressure forces of the pressing members 7, so that the stationary members 13 and the printed board 2 are separated from each other. Therefore, as shown in FIG. 4, the printed board 2 moves downward together with the movable members 14 in a state in which it is forcibly made to contact the movable members 14. By thus providing the pressing members 7, the state in which the printed board 2 remains stuck to the board contact surfaces 13b of the stationary members 13 in spite of the fact that the movable member 14 has moved down can be prevented from occurring. Therefore, the phenomenon that the positions of the mounted electronic components are displaced by the subsequent falling of the printed board 2 onto the movable members 14 and the phenomenon that trouble occurs in conveying the printed board 2 to the next process can be prevented from occurring.

The aforementioned pressure force of the pressing member 7 can be varied according to the design conditions of the material, thickness, aforementioned dimension L and the like of the pressing member 7, and it is proper to set the above design conditions to appropriate values according to the adhesion force exerted between the printed board 2 and the stationary member 13.

Furthermore, the pressing members 7 are arranged in the positions corresponding to the four corners of the printed board 2 in the present embodiment as shown in FIG. 1. However, being not limited to this, the pressing members 7 may be arranged continuously along the edge portion 2a of the printed board 2.

Furthermore, the pressing member 7 has the L-like leaf spring configuration as illustrated in the present embodiment. However, the member 7 is not limited to this. That is, the member 7 is only required to be an elastic member having one end portion to be fixed to the stationary member 13 and the other end portion which is to contact the front surface 2b of the printed board 2 and presses the printed board 2 toward the movable member 14. There can be considered a structure provided by a coil spring for performing the aforementioned pressing operation by the elastic force of the spring, or a structure using an elastic material such as a rubber material and the like.

Furthermore, it is acceptable to adopt a mechanism in which the one end portion is mounted to a member other than the stationary member 13 and the other end portion contacts the printed board 2 and presses the printed board 2 toward the movable member 14, i.e., a separation mechanism for separating the printed board 2 from the stationary member 13.

Furthermore, the front surface 2b of the printed board 2 is arranged on the upper side and the rear surface 2c is arranged on the lower side in the present embodiment. However, it is acceptable to arrange the front and rear surfaces 2b and 2c of the printed board 2 parallel to the vertical direction and grip the printed board 2 laterally with respect to the vertical direction by the stationary member 13 and the movable member 14.

Next, a circuit board holding apparatus 101 according to a second embodiment will be described below.

In this embodiment, in order to forcibly make the printed board 2 contact the movable member 14 when the movable member 14 is moved downward in the stage for releasing the hold of the printed board 2, a suction unit 12 for attracting by suction the rear surface 2c of the printed board 2 is provided as another example of the separation mechanism in place of the aforementioned pressing members 7.

A concrete description will be made. On the rear surface side of the printed board 2 on the X-Y table is provided the suction unit 12 for attracting the printed board 2 by suction at a suction area which does not interfere with the mounting of electronic components onto the printed board 2. As the above suction area, for example, the four corners, a center portion or the like of the printed board 2 can be used. It is to be noted that the suction area is only one center portion of the printed board 2 in this embodiment. The suction unit 12 is provided with a suction pad 120 for attracting by suction the suction area of the printed board 2, a drive unit 121 having, for example, an air cylinder for moving the suction pad 120 upward and downward, and a vacuum unit 123 which is connected to the suction pad 120 by means of a suction hose and which executes a suction operation. Further, in order to synchronize the operation of the drive units 15 for vertically moving the movable members 14 with the operation of the drive unit 121 for vertically moving the suction pad 120 and controlling the suction operation, a control unit 122 to be electrically connected to the drive units 15, the drive unit 121, and the vacuum unit 123 is provided. It is to be noted that the control unit 122 is not shown in FIG. 6.

The operation of the circuit board holding apparatus 101 of the second embodiment having the above construction will be described below.

Similarly to the aforementioned case, after the printed board 2 has been gripped by the stationary member 13 and the movable member 14 and had electronic components mounted thereon, the suction pad 120 moves upward until it will be made to contact the rear surface 2c of the printed board 2 by the operation of the drive unit 121 before the movable members 14 will be moved downward by the operation of the drive units 15. Then, before the movable members 14 are moved downward or simultaneously with the start of the downward movement, the suction of the printed board 2 is started by the vacuum unit 123. Thus, by starting the suction of the printed board 2, the printed board 2 is forcibly made to contact the movable members 14. It is to be noted that the operations of the drive units 15 for the movable members 14, the drive unit 121 for the suction pad 120, and the vacuum unit 123 are controlled by the control unit 122.

Figure 6:
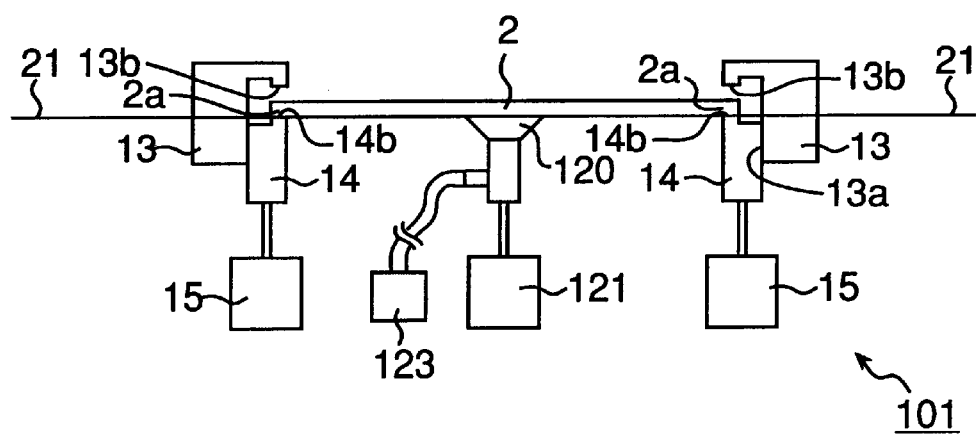
FIG. 6 is a side view showing a state in which the movable members are arranged in a board releasing position in the circuit board holding apparatus shown in FIG. 5.
Figure 7:
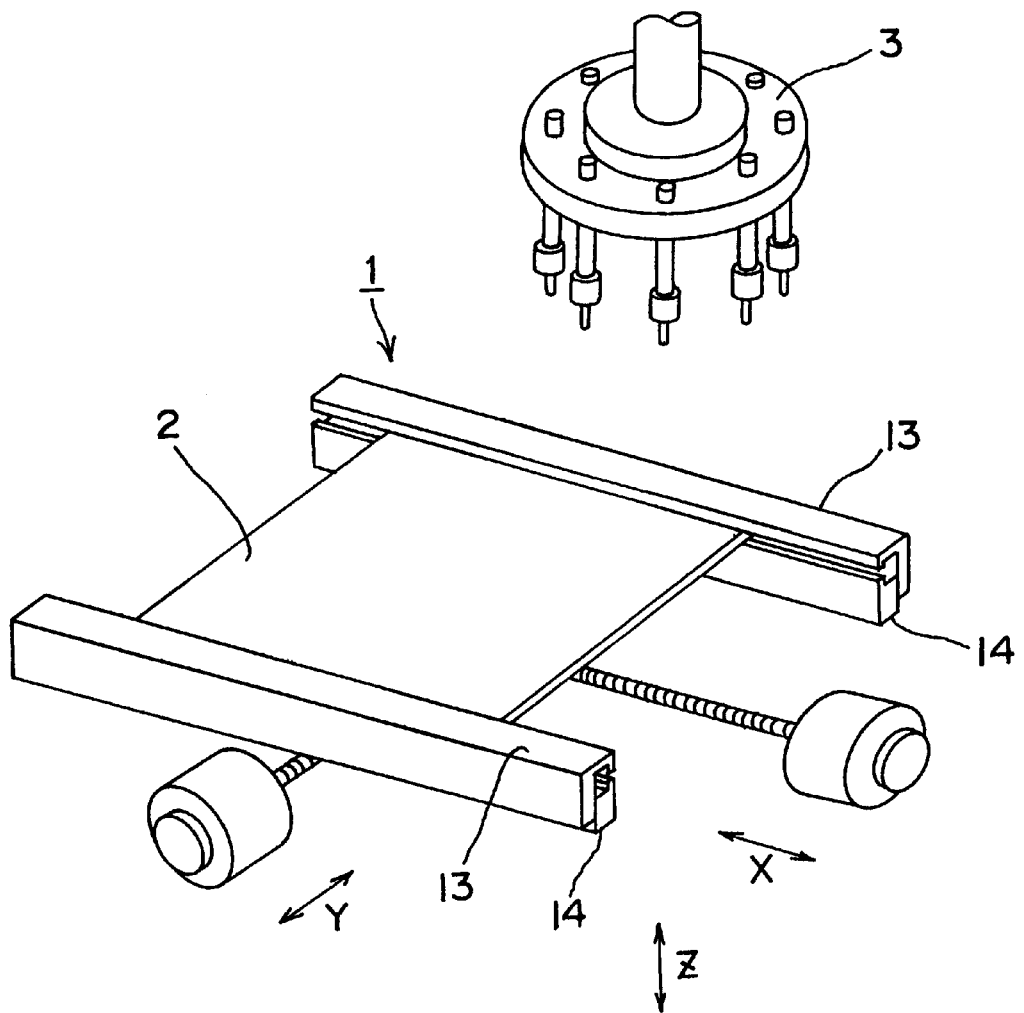
FIG. 7 is a perspective view showing the overall construction of a prior art circuit board holding apparatus.
Figure 8:
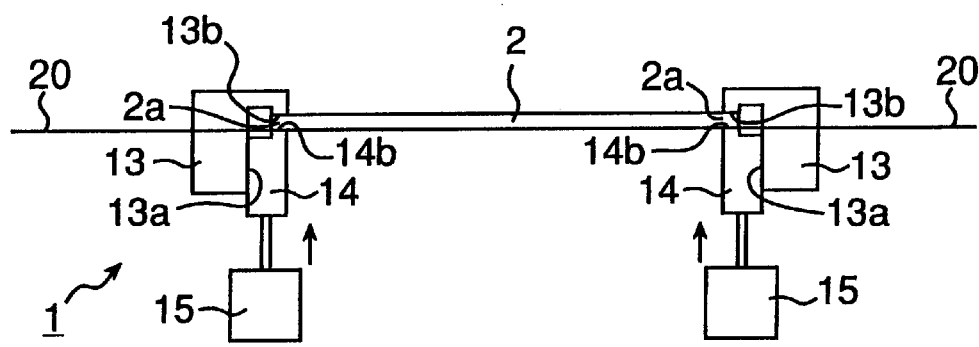
FIG. 8 is a side view showing a state in which movable members are arranged in a board gripping position in the circuit board holding apparatus shown in FIG. 7.
Figure 9:
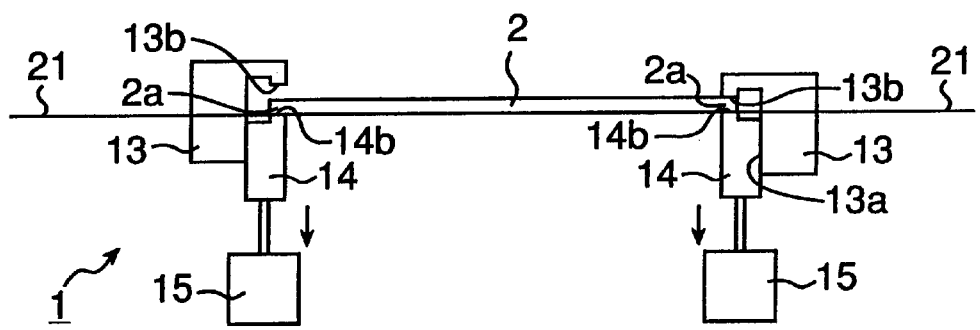
FIG. 9 is a side view showing a state in which movable members are arranged in a board releasing position in the circuit board holding apparatus shown in FIG. 7.
Figure 10:
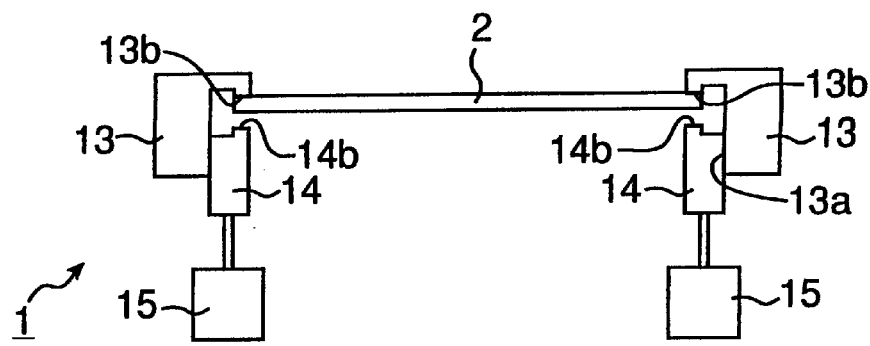
FIG. 10 is a side view showing a state in which a printed board is stuck to the stationary member side in the circuit board holding apparatus shown in FIG. 7.

Therefore, even when the front surface 2b of the printed board 2 is in the state in which it is stuck to the board contact surfaces 13b of the stationary members 13, the stuck state is released by the suction force of the vacuum unit 123. Consequently, as shown in FIG. 6, the printed board 2 moves downward together with the movable members 14 in the state in which the printed board 2 is forcibly made to contact the movable members 14. It is to be noted that the suction operation of the printed board 2 is stopped under the control of the control unit 122 at the point in time when the movable members 14 have moved downward by a specified distance from the board gripping position 20 into the board releasing position 21 or after they have completed the downward movement into the board releasing position 21. By thus providing the suction unit 12, the printed board 2 can be prevented from falling onto the movable members 14, so that the displacement of the arrangement of the already mounted electronic components and the occurrence of trouble in conveying the printed board 2 to the next process can be prevented.

It is also acceptable to arrange the front and rear surfaces 2b and 2c of the printed board 2 parallel to the vertical direction and grip the printed board 2 laterally with respect to the vertical direction by the stationary member 13 and the movable member 14 in this second embodiment.

The movable members 14 are driven by the respective drive units 15. However, being not limited to this, both the movable members 14 may be driven by one drive unit.

Furthermore, as another embodiment of the separation mechanism, it is acceptable to adopt a mechanism in which, for example, a pawl member to be engaged with the printed board 2 is provided and the printed board 2 is forcibly made to contact the movable members 14 by engaging the pawl member with the printed board 2 when releasing the hold of the printed board 2, i.e., a mechanism in which the printed board 2 is forcibly separated from the stationary members 13.

As described in detail above, according to the circuit board holding apparatus of the present invention and the circuit board hold releasing method of the present invention, there is provided the separation mechanism for forcibly separating the circuit board from the stationary member when the movable member moves from the board gripping position to the board releasing position during releasing of the hold of the circuit board achieved by the stationary member and the movable member. With this arrangement, even when the circuit board is in the state in which it is stuck to the stationary member, the circuit board is forcibly released from the stuck state and moved downward together with the movable member. Therefore, the stationary member does not fall onto the movable member after the movable member has moved downward to the board releasing position, so that displacement of the positions of the electronic components mounted on the circuit board or a state in which the circuit board cannot be conveyed to the next process can be prevented from occurring.

The entire disclosure of Japanese Patent Application No. 8-161951 filed on Jun. 21, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A circuit board holding apparatus for holding a circuit board by gripping a pair of opposed edge portions of the circuit board, comprising:

stationary members to be arranged opposite the edge portions of the circuit board for contacting a front surface of the circuit board;

movable members movable with respect to said stationary members between a board gripping position in which the edge portions of the circuit board are gripped between said movable members and said stationary members when the circuit board is disposed therebetween, and a board releasing position, for contacting a rear surface of the circuit board and moving the circuit board in a thickness direction thereof when said movable members move from said board releasing position toward said board gripping position; and a separation mechanism for forcibly separating the circuit board from said stationary members in a direction of movement of said movable members when said movable members move from said board gripping position to toward said board releasing position to release the circuit board from said stationary members;

wherein said separation mechanism comprises at least one pressing member mounted to one of said stationary members to cause the circuit board to be put in pressure contact with at least one of said movable members.

2. A circuit board holding apparatus as claimed in claim 1, wherein said at least one pressing member comprises an elastic member having one end portion fixed to said one of said stationary members and the other end portion which is to contact the front surface of the circuit board to press the circuit board against said at least one of said movable members when said movable members are in said board gripping position.

3. A circuit board holding apparatus as claimed in claim 2, wherein when the front and rear surfaces of the circuit board are faced upwardly and downwardly, respectively, said movable member is movable vertically.

4. A circuit board holding apparatus as claimed in claim 3, wherein said separation mechanism operates to separate the circuit board from said stationary members on confronting sides of the circuit board when said movable members move from said board gripping position toward said board releasing position.

5. A circuit board holding apparatus as claimed in claim 1, wherein said separation mechanism comprises a pair of pressing members mounted to each of said stationary members to cause the circuit board to be in pressure contact with each of said movable members.

6. A circuit board holding apparatus as claimed in claim 1, wherein said separation mechanism comprises at least one pressing member mounted to each of said stationary members to cause the circuit board to be in pressure contact with each of said movable members.

7. A circuit board holding apparatus as claimed in claim 1, wherein said separation mechanism operates to separate the circuit board from said stationary members on confronting sides of the circuit board when said movable members move from said board gripping position toward said board releasing position.

8. A circuit board holding apparatus for holding a circuit board by gripping a pair of opposed edge portions of the circuit board, comprising:

stationary members to be arranged opposite the edge portions of the circuit board for contacting a front surface of the circuit board;

movable members movable with respect to said stationary members between a board gripping position in which the edge portions of the circuit board are gripped between said movable members and said stationary members when the circuit board is disposed therebetween, and a board releasing position, for contacting a rear surface of the circuit board and moving the circuit board in a thickness direction thereof when said movable members move from said board releasing position toward said board gripping position; and a separation mechanism for forcibly separating the circuit board from said stationary members in a direction of movement of said movable members when said movable members move from said board gripping position toward said board releasing position to release the circuit board from said stationary members;

wherein said separation mechanism comprises a suction unit including a suction section to be arranged on a rear surface side of the circuit board for attracting the rear surface of the circuit board by suction, and a drive unit which moves said suction section in the direction of movement of said movable members when said movable members are moved; and wherein said separation mechanism operates to separate the circuit board from said stationary members on confronting sides of the circuit board when said movable members move from said board gripping position toward said board releasing position.

9. A circuit board holding apparatus for holding a circuit board by gripping a pair of opposed edge portions of the circuit board, comprising:

stationary members to be arranged opposite the edge portions of the circuit board for contacting a front surface of the circuit board;

movable members movable with respect to said stationary members between a board gripping position in which the edge portions of the circuit board are gripped between said movable members and said stationary members when the circuit board is disposed therebetween, and a board releasing position, for contacting a rear surface of the circuit board and moving the circuit board in a thickness direction thereof when said movable members move from said board releasing position toward said board gripping position; and a separation mechanism for forcibly separating the circuit board from said stationary members in a direction of movement of said movable members when said movable members move from said board gripping position toward said board releasing position to release the circuit board from said stationary members;

wherein said separation mechanism comprises a suction unit including a suction section to be arranged on a rear surface side of the circuit board for attracting the rear surface of the circuit board by suction, and a drive unit which moves said suction section in the direction of movement of said movable members when said movable members are moved;

wherein a control unit is provided to control a start of movement of said movable members from said board gripping position toward said board releasing position, a start of suction of the circuit board by said suction unit, and movement of said suction unit by said drive unit; and wherein said separation mechanism operates to separate the circuit board from said stationary members on confronting sides of the circuit board when said movable members move from said board gripping position toward said board releasing position.

* * * * *